United States Patent
Kuno et al.

(10) Patent No.: US 12,266,515 B2
(45) Date of Patent: Apr. 1, 2025

(54) WAFER PLACEMENT TABLE

(71) Applicant: NGK Insulators, Ltd., Nagoya (JP)

(72) Inventors: Tatsuya Kuno, Nagoya (JP); Seiya Inoue, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 166 days.

(21) Appl. No.: 18/173,889

(22) Filed: Feb. 24, 2023

(65) Prior Publication Data

US 2023/0343566 A1    Oct. 26, 2023

(30) Foreign Application Priority Data

Apr. 26, 2022 (JP) ................ 2022-072510

(51) Int. Cl.
*H01J 37/32* (2006.01)
*H01L 21/683* (2006.01)

(52) U.S. Cl.
CPC .... *H01J 37/32724* (2013.01); *H01L 21/6833* (2013.01); *H01J 2237/002* (2013.01); *H01J 2237/2007* (2013.01)

(58) Field of Classification Search
CPC ........... H01J 37/32724; H01J 2237/002; H01J 2237/2007; H01J 37/20; H01L 21/6833; H01L 21/67103; H01L 21/67109; H01L 21/6831; H01L 21/68785; H01L 21/67248; H01L 21/683; H01L 21/68757
USPC ....................................................... 361/234
See application file for complete search history.

(56) References Cited

U.S. PATENT DOCUMENTS

| | | |
|---|---|---|
| 2014/0209245 A1 | 7/2014 | Yamamoto et al. |
| 2016/0111315 A1 | 4/2016 | Parkhe |
| 2017/0256431 A1 | 9/2017 | Parkhe |

FOREIGN PATENT DOCUMENTS

| | | | | |
|---|---|---|---|---|
| CN | 116130324 A | * | 5/2023 | ........ H01J 37/32724 |
| JP | 2014-150104 A | | 8/2014 | |
| TW | 201438139 A | | 10/2014 | |
| TW | 201626497 A | | 7/2016 | |
| TW | 202114041 A | | 4/2021 | |
| WO | WO-2018038044 A1 | * | 3/2018 | ............... B23Q 3/15 |

OTHER PUBLICATIONS

Title: wafer mouting table: JP WO 201803804; entire specification and drawings (Year: 2019).*
Taiwanese Office Action (Application No. 112107748) dated Oct. 4, 2023 (6 pages).

* cited by examiner

*Primary Examiner* — Dharti H Patel
(74) *Attorney, Agent, or Firm* — BURR PATENT LAW, PLLC

(57) ABSTRACT

A wafer placement includes an alumina substrate having a wafer placement surface at an upper surface, and incorporating an electrode; a brittle cooling substrate which is bonded to a lower surface of the alumina substrate, and in which a refrigerant flow path is formed; and a ductile connection member stored in a storage hole opened in a lower surface of the cooling substrate in a state of restricted axial rotation and in a state of being engaged with an engagement section of the storage hole, the ductile connection member having a male thread section or a female thread section, wherein the storage hole is provided in the refrigerant flow path.

12 Claims, 8 Drawing Sheets

WAFER PLACEMENT TABLE

BACKGROUND OF THE INVENTION

1. Field of the Invention

The present invention relates to a wafer placement table.

2. Description of the Related Art

In a known conventional wafer placement table, a ceramic substrate incorporating an electrode and a cooling substrate in which a refrigerant flow path is formed are bonded with an adhesive. PTL 1 describes an example in which such a wafer placement table is placed on an installation plate and fixed by a screw. Specifically, a female thread hole is provided in the lower surface of a cooling substrate, and the male thread of a bolt inserted into a thread insertion hole from below is screwed into the female thread hole, the thread insertion hole penetrating the installation plate vertically.

CITATION LIST

Patent Literature

PTL 1: JP 2014-150104 A

SUMMARY OF THE INVENTION

However, when a female thread hole is provided in the lower surface of the cooling substrate, and the male thread of a bolt inserted in the installation plate is screwed into the female thread hole, if the material of the cooling substrate is a ductile material (for example, aluminum), no problem arises, but if the cooling substrate is a brittle material (for example, a metal matrix composite), a problem arises. Specifically, the female thread hole of the cooling substrate is pulled down locally by a large force via the bolt, thus if an inductile material is used for the cooling substrate, it may be broken. In addition, there is a demand that temperature singularity should be prevented from occurring in a wafer as much as possible.

The present invention has been devised to solve such a problem, and it is a main object to make it possible to tighten the wafer placement table including a brittle cooling substrate to the installation plate without any problem, and to prevent temperature singularity from occurring in a wafer.

[1] A wafer placement table of the present invention includes an alumina substrate having a wafer placement surface at an upper surface, and incorporating an electrode; a brittle cooling substrate which is bonded to a lower surface of the alumina substrate, and in which a refrigerant flow path is formed; and a ductile connection member stored in a storage hole opened in a lower surface of the cooling substrate in a state of restricted axial rotation and in a state of being engaged with an engagement section of the storage hole, the ductile connection member having a male thread section or a female thread section. The storage hole is provided in the refrigerant flow path.

In the wafer placement table, the connection member having the male thread section or the female thread section is stored in the storage hole opened in the lower surface of the cooling substrate in a state of restricted axial rotation and in a state of being engaged with the engagement section of the storage hole. Since axial rotation of the connection member is restricted, it can be screwed to a to-be-connected member having the male thread section or the female thread section disposed on the lower surface side of the cooling substrate. In addition, even when the connection member in a state of being engaged with the engagement section of the storage hole is pulled toward the installation plate by the to-be-connected member provided in the installation plate, the connection member is unlikely to break because of its ductility. Therefore, it is possible to tighten the wafer placement table including a brittle cooling substrate to the installation plate without any problem. Furthermore, the storage hole is provided in the refrigerant flow path. When a refrigerant flow path is laid out avoiding the storage hole, the portion of a wafer, immediately above the storage hole is not sufficiently cooled, thus temperature singularity is likely to occur. However, the storage hole is provided in the refrigerant flow path herein, such temperature singularity can be prevented from occurring.

Note that in the present specification, the present invention may be described using up and down, right and left, and front and back; however up and down, right and left, and front and back merely indicate a relative positional relationship. Thus, when the orientation of the wafer placement table is changed, up and down may change to right and left, or right and left may change to up and down, and such a case is also included in the technical scope of the present invention. The "refrigerant flow path" may be a refrigerant flow path provided inside the cooling substrate, or may be a refrigerant flow path groove provided in the upper surface or the lower surface of the cooling substrate.

[2] In the wafer placement table (the wafer placement table according to [1]) of the present invention, the connection member may be a member having the female thread section, and being screwable to a male thread of a bolt inserted from a lower surface side of the cooling substrate.

[3] In the wafer placement table (the wafer placement table according to [1] or [2]) of the present invention, the cooling substrate may be composed of a metal matrix composite of metal and ceramic, or an alumina material. Because a composite material of metal and ceramic and an alumina material are brittle materials, application of the present invention has high significance. For example, when a composite material of metal and ceramic is used, it is preferable that a composite material having the same thermal expansion coefficient as alumina be used.

[4] In the wafer placement table (the wafer placement table according to any one of [1] to [3]) of the present invention, the engagement section may be a step section or an inclined section provided in an inner peripheral surface of the storage hole, and the connection member may have a to-be-engaged section which is to be engaged with the engagement section to prevent the connection member from falling from the storage hole. In this way, the engagement section and the to-be-engaged section can be produced relatively easily. For example, when the engagement section is a step section, the connection member may be provided with a to-be-engaged section which hooks to the step section. When the engagement section is an inclined section, the connection member may be provided with an inclined surface as the to-be-engaged section, the inclined surface conforming to the inclined section.

[5] In the wafer placement table (the wafer placement table according to any one of [1] to [4]) of the present invention, when being attempted to be axially rotated, the connection member may come into contact with a wall of the storage hole to undergo restricted axial rotation. In this way, axial rotation of the connection member can be restricted by a relatively simple configuration.

[6] In the wafer placement table (the wafer placement table according to any one of [1] to [5]) of the present invention, the cooling substrate may have a single-layered structure. In this way, the cooling substrate does not need to be manufactured by bonding layers, thus the manufacturing cost for the cooling substrate can be reduced.

[7] In the wafer placement table (the wafer placement table according to [6]) of the present invention, the refrigerant flow path may have a refrigerant flow path groove provided in an upper surface or a lower surface of the cooling substrate. For example, when the upper surface of the cooling substrate has a refrigerant flow path groove, the refrigerant flow path is formed by covering the upper surface of the refrigerant flow path groove with the alumina substrate (or a bonding layer that bonds the alumina substrate and the cooling substrate). In addition, when the lower surface of the cooling substrate has a refrigerant flow path groove, the refrigerant flow path is formed by covering the lower surface of the refrigerant flow path groove with a plate member (for example, an installation plate).

[8] In the wafer placement table (the wafer placement table according to any one of [1] to [7]) of the present invention, the refrigerant flow path may include a plurality of lines each provided from one end to the other end in a one-stroke pattern in a plan view, and the storage hole may be provided in one or more of the plurality of lines.

DETAILED DESCRIPTION OF THE INVENTION

Figure 1:
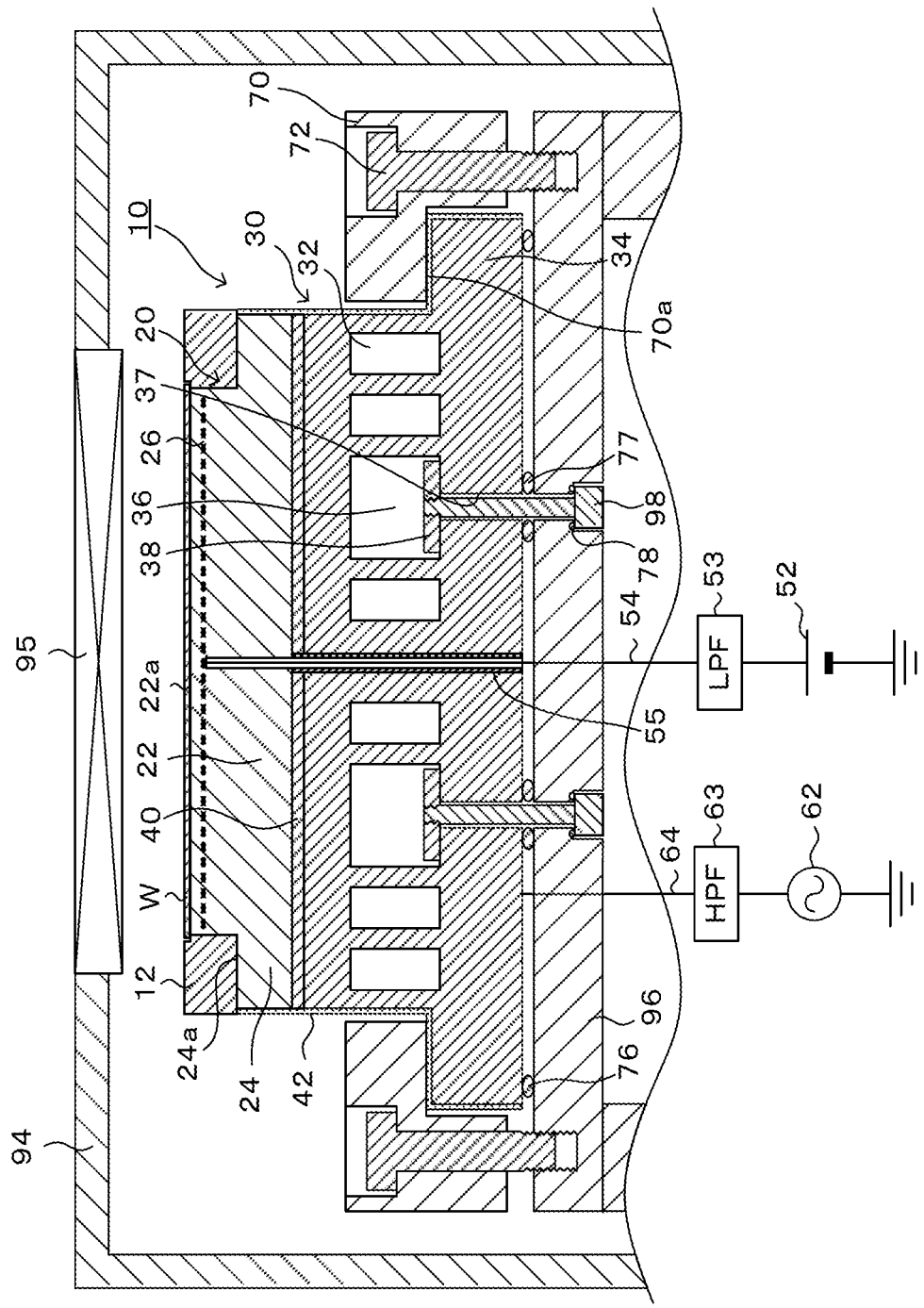
FIG. 1 is a vertical cross-sectional view of a wafer placement table 10 installed in a chamber 94.
Figure 2:
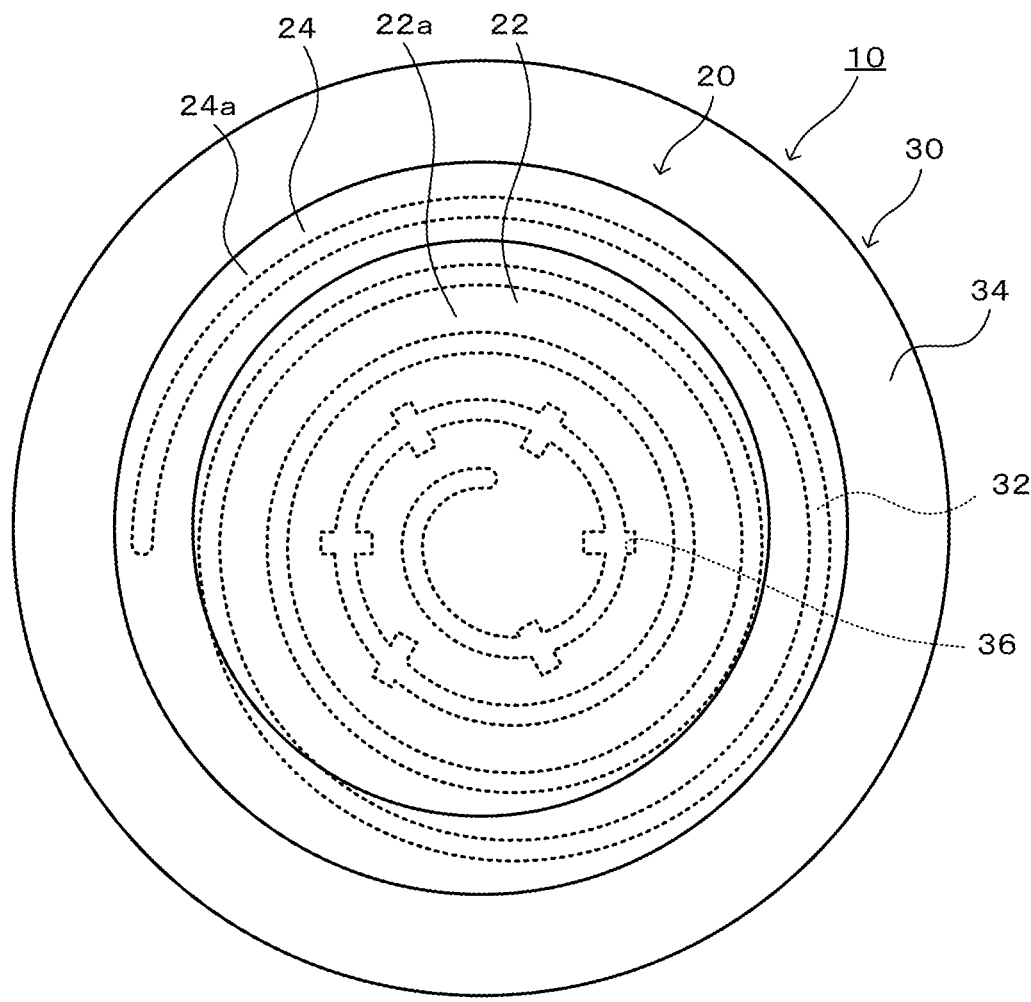
FIG. 2 is a plan view of the wafer placement table 10.
Figure 3:
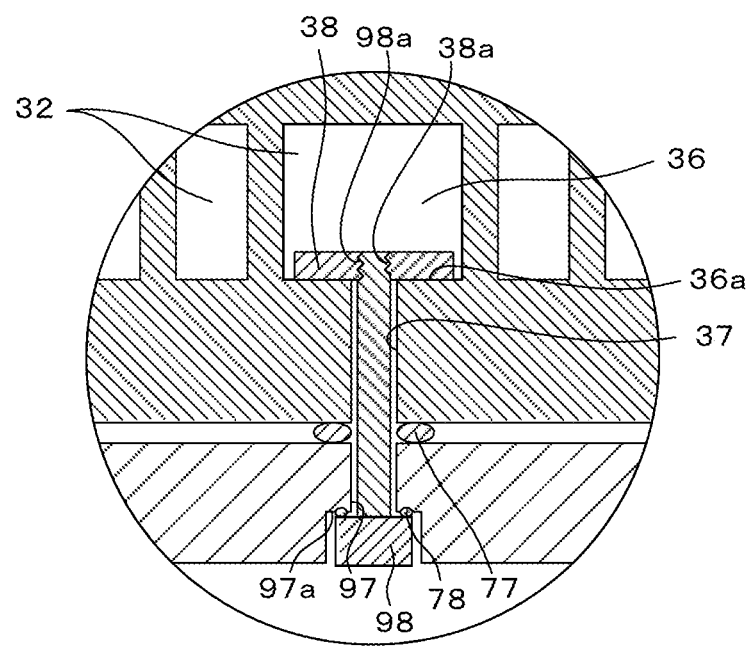
FIG. 3 is an enlarged cross-sectional view illustrating the vicinity of a storage hole 36 and a female thread member 38.
Figure 4:
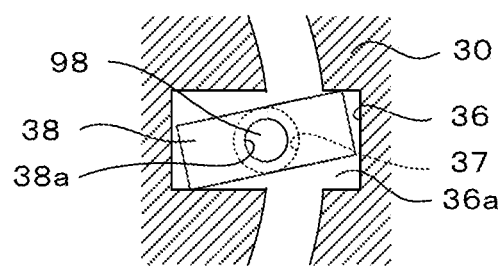
FIG. 4 is a cross-sectional view from above when the storage hole 36 is cut horizontally.

A preferred embodiment of the present invention will be described below with reference to the accompanying drawings. FIG. 1 is a vertical cross-sectional view (cross-sectional view taken along a plane including the central axis of the wafer placement table 10) of a wafer placement table 10 installed in a chamber 94, FIG. 2 is a plan view of the wafer placement table 10, FIG. 3 is an enlarged cross-sectional view illustrating the vicinity of a storage hole 36 and a female thread member 38, and FIG. 4 is a cross-sectional view from above when the storage hole 36 is cut horizontally.

The wafer placement table 10 is used to perform CVD or etching on a wafer W utilizing plasma, and fixed to an installation plate 96 provided inside the chamber 94 for semiconductor process. The wafer placement table 10 includes an alumina substrate 20, a cooling substrate 30, and a metal bonding layer 40.

The alumina substrate 20 includes an outer peripheral section 24 having an annular focus ring placement surface 24a on the outer periphery of a central section 22 having a circular wafer placement surface 22a. Hereinafter the focus ring may be abbreviated as "FR". A wafer W is placed on the wafer placement surface 22a, and a focus ring 12 is placed on the FR placement surface 24a. The FR placement surface 24a is lower by one step than the wafer placement surface 22a.

A wafer adsorption electrode 26 is incorporated in the central section 22 of the alumina substrate 20 at a position close to the wafer placement surface 22a. The wafer adsorption electrode 26 is composed of materials containing W, Mo, WC, MoC, for example. The wafer adsorption electrode 26 is a disk-shaped or mesh-shaped monopole electrostatic adsorption electrode. The layer, above the wafer adsorption electrode 26, of the alumina substrate 20 functions as a dielectric layer. A wafer adsorption DC power supply 52 is coupled to the wafer adsorption electrode 26 via a power supply terminal 54. The power supply terminal 54 is provided from the lower surface of the alumina substrate 20 to the wafer adsorption electrode 26 through an insulation pipe 55 disposed in a through-hole vertically penetrating the cooling substrate 30 and the metal bonding layer 40. A low pass filter (LPF) 53 is provided between the wafer adsorption DC power supply 52 and the wafer adsorption electrode 26.

The cooling substrate 30 is a disk member composed of a brittle conductive material. The cooling substrate 30 internally includes a refrigerant flow path 32 through which a refrigerant can be circulated. As illustrated in FIG. 2, the refrigerant flow path 32 is provided from one end (entry) to the other end (exit) in a one-stroke pattern to cover the entire surface of the alumina substrate 20 in a plan view. The one end and the other end of the refrigerant flow path 32 are respectively connected to a refrigerant supply path and a refrigerant discharge path which are provided in the installation plate 96 and not illustrated. The refrigerant discharged through the refrigerant discharge path undergoes temperature control, then is returned to the refrigerant supply path again. The refrigerant flowing through the refrigerant flow path 32 is preferably liquid, and preferably has an electrical insulating property. As electrically insulative liquid, for example, fluorine-based inert liquid may be mentioned. As a brittle conductive material, a composite material of metal and ceramic may be mentioned. As a composite material of metal and ceramic, a metal matrix composite (MMC) and a ceramic matrix composite (CMC) may be mentioned. Specific examples of such a composite material include a material containing Si, SiC and Ti, a material obtained by impregnating SiC porous body with Al and/or Si, and a composite material of $Al_2O_3$ and TiC. A material containing Si, SiC and Ti is called SiSiCTi, a material obtained by impregnating SiC porous body with Al is called AlSiC, and a material obtained by impregnating SiC porous body with Si is called SiSiC. As the conductive material used for the cooling substrate 30, AlSiC and SiSiCTi having a thermal expansion coefficient closer to that of alumina are preferable. The cooling substrate 30 is coupled to an RF power supply 62 via a power supply terminal 64. A high pass filter (HPF) 63 is disposed between the cooling substrate 30 and the RF power supply 62. The cooling substrate 30 has a flange 34 near its lower surface, used to clamp the wafer placement table 10 to the installation plate 96.

The cooling substrate 30 is provided with a plurality of storage holes 36, in each of which a female thread member 38 (connection member) is stored. The plurality of (for example, six or eight) storage holes 36 are provided at approximately regular intervals substantially along a concentric circle (a circle with a diameter equal to ½ or ⅓ the diameter of the wafer W, for example) of the cooling substrate 30. In other words, as illustrated in FIG. 2, the plurality of storage holes 36 are provided in a region near the center of the wafer placement table 10. As illustrated in FIG. 3, each storage hole 36 is opened in the lower surface of the cooling substrate 30 through an insertion path 37 extending vertically. The storage hole 36 is a cuboid-shaped space provided inside the refrigerant flow path 32. The connection section between the storage hole 36 and the insertion path 37 is a step section 36a. The step section 36a is the horizontal bottom surface of the storage hole 36. The storage hole 36 stores a female thread member 38. The female thread member 38 is a rectangular nut in a plan view, and has a thread hole 38a, which is a female thread, in the center. Since the lower surface of the female thread member 38 is engaged (in contact) with the step section 36a of the storage hole 36, the female thread member 38 does not fall from the storage hole 36. As illustrated in FIG. 4, when the female thread member 38 is attempted to be axially rotated, the female thread member 38 comes into contact with the side walls of the storage hole 36 to undergo restricted axial rotation. The female thread member 38 is composed of a ductile material (for example, Ti, Mo, W).

The metal bonding layer 40 bonds the lower surface of the alumina substrate 20 and the upper surface of the cooling substrate 30. The metal bonding layer 40 may be a layer composed of solder or a metal brazing material, for example. The metal bonding layer 40 is formed by TCB (Thermal compression bonding), for example. TCB is a publicly known method, by which a metal bonding material is inserted between two members to be bonded, and the two members are pressure-bonded in a state of heated to a temperature lower than or equal to the solidus temperature of the metal bonding material.

The lateral surface of the outer peripheral section 24 of the alumina substrate 20, the outer periphery of the metal bonding layer 40 and the lateral surface of the cooling substrate 30 are covered with an insulating film 42. As the insulating film 42, for example, a thermal spray film such as alumina and yttria may be mentioned.

The wafer placement table 10 is mounted on the installation plate 96 provided inside the chamber 94 with seal rings 76, 77 interposed between the wafer placement table 10 and the installation plate 96. The seal rings 76, 77 are made of metal or resin. The seal ring 76 is disposed slightly inward of the outer edge of the cooling substrate 30. The seal ring 77 is disposed to surround the periphery of the foot of a bolt 98 to prevent the refrigerant from leaking outwardly of the seal ring 77.

The outer peripheral area of the wafer placement table 10 is attached to the installation plate 96 using a clamping member 70. The clamping member 70 is an annular member with a substantially inverted L-shaped cross section, and has an inner peripheral stepped surface 70a. With the inner peripheral stepped surface 70a of the clamping member 70 placed on the flange 34 of the cooling substrate 30 of the wafer placement table 10, bolts 72 are each inserted through the upper surface of the clamping member 70 and screwed into a thread hole provided on the upper surface of the installation plate 96. The bolts 72 are attached to multiple sites (for example, eight sites or 12 sites) provided at regular intervals in the circumferential direction of the clamping member 70. The clamping member 70 and the bolts 72 may be produced with an insulating material, or produced with a conductive material (such as metal). In addition, the central area of the wafer placement table 10 is attached to the installation plate 96 using bolts 98 (to-be-connected members). As illustrated in FIG. 3, the foot of each bolt 98 is provided with a male thread 98a. The bolt 98 is inserted into a through-hole 97 provided at the position, opposed to the storage hole 36, of the installation plate 96 through the lower surface of the installation plate 96, and the male thread 98a is screwed into the thread hole 38a of the female thread member 38 in the storage hole 36. The through-hole 97 has a smaller diameter in the upper section and a larger diameter in the lower section, and has a step section 97a between the upper section and the lower section. The head of the bolt 98 hooks to the step section 97a of the through-hole 97 with a seal ring 78 interposed therebetween. The seal ring 78 is made of metal or resin, and prevents the refrigerant in the storage hole 36 from leaking outward through the insertion path 37. Since the female thread member 38 is stored in the storage hole 36 in a state of restricted axial rotation, the bolt 98 can be screwed into the female thread member 38. When the bolt 98 is screwed into the female thread member 38, the female thread member 38 is set in a state of being pulled toward the installation plate 96 with engaged with the step section 36a of the storage hole 36.

At the time of use of the wafer placement table 10, the wafer placement surface 22a side of the alumina substrate 20 becomes vacuum, the lower surface side of the cooling substrate 30 becomes the atmosphere, thus the wafer placement table 10 tends to project upward. When the wafer W is treated with a high-power plasma, the wafer placement surface 22a side of the alumina substrate 20 has a high temperature, and the lower surface side has a low temperature, thus the wafer placement surface 22a side tends to extend, and the wafer placement table 10 tends to project upward. However, in the embodiment, the central area of the wafer placement table 10 is fixed by the bolts 98, thus, it is possible to prevent the wafer placement table 10 from projecting upward. Also, the seal rings 76, 77 are disposed between the central area of the lower surface of the cooling substrate 30 and the upper surface of the installation plate 96, and the central area of the lower surface of the wafer placement table 10 is fixed by the bolts 98, thus the seal rings 76, 77 are maintained in a firmly crushed state. The one end and the other end of the refrigerant flow path 32 are respectively connected via seal rings disposed between the cooling substrate 30 and the installation plate 96 to the refrigerant supply path and the refrigerant discharge path which are provided in the installation plate 96 and not illustrated. These seal rings prevent the refrigerant from leaking outward. These seal rings are also maintained in a firmly crushed state.

Figure 5:
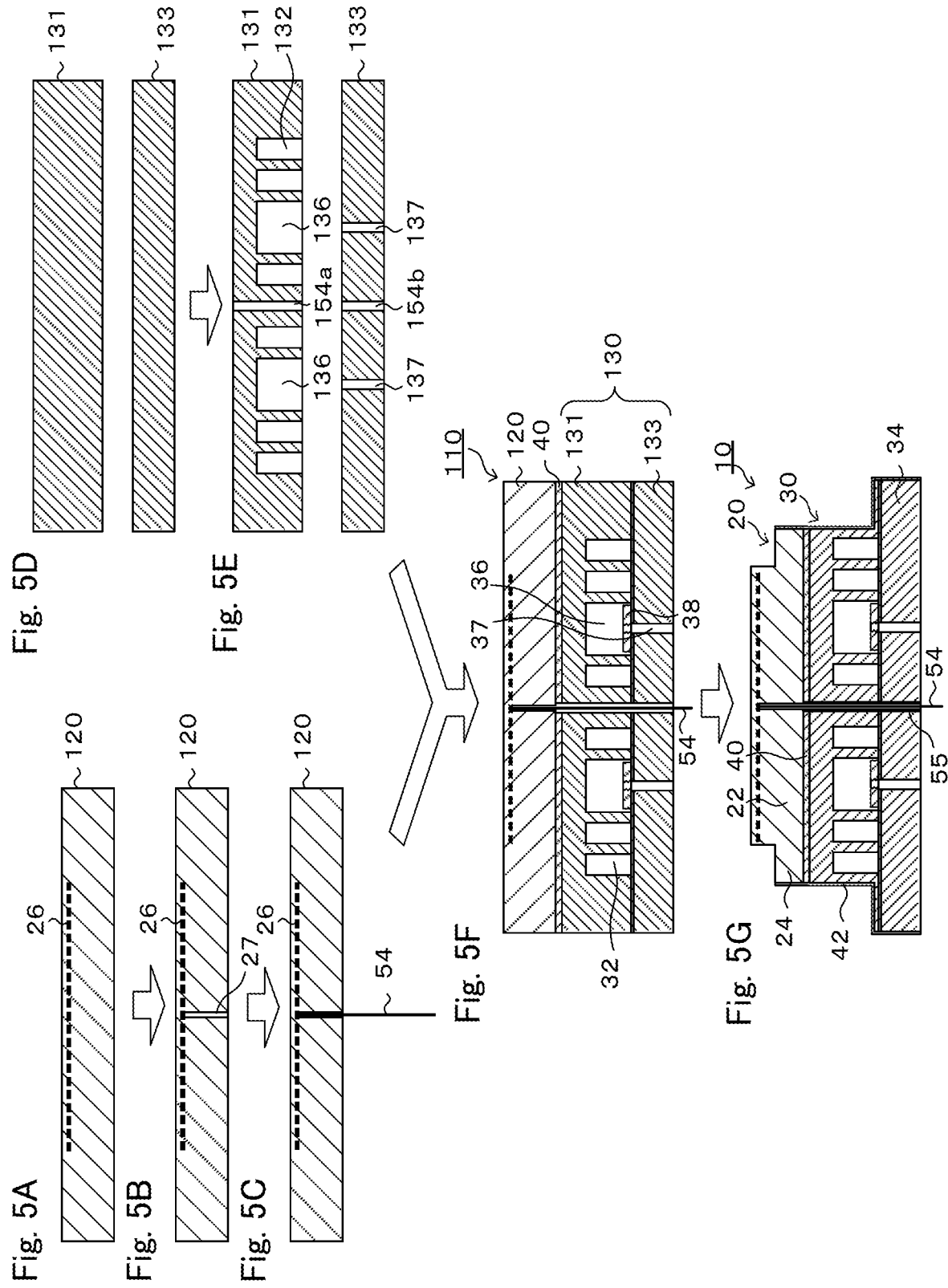
FIGS. 5A to 5G are manufacturing process views of the wafer placement table 10.

Next, a manufacturing example of the wafer placement table 10 will be described using FIGS. 5A to 5G. FIGS. 5A to 5G are manufacturing process views of the wafer placement table 10. First, a disk-shaped alumina sintered body 120, from which the alumina substrate 20 is made, is produced by hot-press firing of a molded body of alumina powder (FIG. 5A). The wafer adsorption electrode 26 is incorporated in the alumina sintered body 120. Next, a hole 27 is formed from the lower surface of the alumina sintered body 120 to the wafer adsorption electrode 26 (FIG. 5B), and the power supply terminal 54 is inserted into the hole 27 to bond the power supply terminal 54 to the wafer adsorption electrode 26 (FIG. 5C).

Concurrently, two disk members 131, 133 are produced (FIG. 5D). Then a groove 132, which eventually serves as the refrigerant flow path 32, is formed in the lower surface of the upper disk member 131. A groove 136, which eventually serves as the storage hole 36, is formed in part of the groove 132. In addition, a through-hole 137, which eventually serves as the insertion path 37, is formed in the lower disk member 133. Furthermore, vertically penetrating through-holes 154a, 154b are formed in the two disk members 131, 133 (FIG. 5E). These through-holes 154a, 154b eventually serves as a hole for inserting the power supply terminal 54. The disk members 131, 133 are preferably made of SiSiCTi or AlSiC. This is because the thermal expansion coefficient of alumina is approximately the same as the thermal expansion coefficients of SiSiCTi and AlSiC.

A disk member made of SiSiCTi can be produced as follows, for example. First, silicon carbide, metal Si and metal Ti are mixed to produce a powder mixture. Next, a disk-shaped molded body is produced by applying uniaxial pressure molding to the obtained powder mixture, and hot-press sintering is applied to the molded body in an inert atmosphere to obtain a disk member made of SiSiCTi.

Subsequently, a first metal bonding material is disposed on the upper surface of the lower disk member 133. Vertically penetrating holes are provided at positions of the first metal bonding material, the positions being opposed to the through-hole 137 and the through-hole 154b. Next, the female thread member 38 is disposed above the hole of the first metal bonding material, opposed to the through-hole 137, and the upper disk member 131 is disposed on the first metal bonding material. In this process, the female thread member 38 is stored in the groove 136 of the disk member 131. Next, a second metal bonding material is disposed on the upper surface of the disk member 131. A vertically penetrating hole is provided at a position of the second metal bonding material, the position being opposed to the through-hole 154a. Then the alumina sintered body 120 is placed on the second metal bonding material while the power supply terminal 54 of the alumina sintered body 120 is being inserted into the through-holes 154a, 154b of the disk members 131, 133. Thus, a layered body is obtained, in which the disk member 133, the first metal bonding material, the disk member 131, the second metal bonding material and the alumina sintered body 120 are layered in that order from the bottom. A bonded body 110 is obtained (FIG. 5F) by pressurizing the layered body while heating it (TCB).

The bonded body 110 is such that the alumina sintered body 120 is bonded to the upper surface of a circular block 130 from which the cooling substrate 30 is produced, with the metal bonding layer 40 interposed between the circular block 130 and the alumina sintered body 120. The circular block 130 is a layered structure body such that the upper disk member 131 and the lower disk member 133 are bonded with a metal bonding layer interposed therebetween. The circular block 130 internally has the refrigerant flow path 32 and the storage hole 36. In addition, the female thread member 38 is stored in the storage hole 36.

TCB is performed, for example, in the following manner. Specifically, a layered body is pressurized and bonded at a temperature (for example, the solidus temperature minus 20° C. or higher and the solidus temperature or lower) lower than or equal to the solidus temperature of the metal bonding material, and subsequently, the temperature is returned to the room temperature.

Consequently, the metal bonding material becomes a metal bonding layer. As the metal bonding material then, an Al—Mg based bonding material and an Al—Si—Mg based bonding material may be used. For example, when TCB is performed using an Al—Si—Mg based bonding material, the layered body is pressurized in a state of heated in a vacuum atmosphere. A metal bonding material with a thickness of approximately 100 μm is preferably used.

Subsequently, the outer periphery of the alumina sintered body 120 is ground to form a step, thus the alumina substrate 20 including the central section 22 and the outer peripheral section 24 is produced. In addition, the outer periphery of the circular block 130 is ground to form a step, thus the cooling substrate 30 including the flange 34 is produced. In addition, the insulation pipe 55 is inserted into an insertion hole for the power supply terminal 54, provided in the circular block 130 and the metal bonding layer 40. Furthermore, the insulating film 42 is formed by using alumina powder to thermally spray the lateral surface of the outer peripheral section 24 of the alumina substrate 20, the periphery of the metal bonding layer 40 and the lateral surface of the cooling substrate 30 (FIG. 5G). Consequently, the wafer placement table 10 is obtained.

Next, an example of use of the wafer placement table 10 will be described using FIG. 1. As described above, the outer peripheral area of the wafer placement table 10 is fixed to the installation plate 96 of the chamber 94 by the clamping member 70, and the central area of the wafer placement table 10 is fixed by the bolts 98. On the ceiling surface of the chamber 94, a shower head 95 is disposed which injects a process gas through a large number of gas injection holes to the inside of the chamber 94. The installation plate 96 is composed of an insulating material such as alumina, for example.

The focus ring 12 is placed on the FR placement surface 24a of the wafer placement table 10, and a disk-shaped wafer W is placed on the wafer placement surface 22a. The focus ring 12 includes a step along the inner periphery of the upper end so as not to interfere with the wafer W. In this state, a DC voltage of the wafer adsorption DC power supply 52 is applied to the wafer adsorption electrode 26 to cause the wafer placement surface 22a to adsorb the wafer W. The inside of the chamber 94 is set to have a predetermined vacuum atmosphere (or a reduced pressure atmosphere), and an RF voltage from the RF power supply 62 is applied to the cooling substrate 30 while supplying a process gas from the shower head 95. Then a plasma is generated between the wafer W and the shower head 95. The plasma is utilized to perform CVD film formation and etching on the wafer W. Note that the focus ring 12 is also worn out along with plasma treatment of the wafer W, and the focus ring 12 is replaced after several wafers W are treated because the focus ring 12 is thicker than the wafer W.

When the wafer W is treated with a high-power plasma, it is necessary to cool the wafer W efficiently. In the wafer placement table 10, as the bonding layer between the alumina substrate 20 and the cooling substrate 30, the metal bonding layer 40 having a high thermal conductivity is used instead of a resin layer having a low thermal conductivity. Thus, the capability (heat removal capability) to remove heat from the wafer W is high. In addition, the thermal expansion difference between the alumina substrate 20 and the cooling substrate 30 is small, thus even when the stress relaxation performance of the metal bonding layer 40 is low, a problem is unlikely to occur.

In the wafer placement table 10 described above, each female thread member 38 is stored in the storage hole 36 opened in the lower surface of the cooling substrate 30 in a state of restricted axial rotation and in a state of being engaged with the step section 36a (engagement section) of the storage hole 36 so as not to fall from the storage hole 36. Since axial rotation of the female thread member 38 is restricted, the male thread 98a of the bolt 98 inserted from the lower surface side of the cooling substrate 30 can be screwed into the female thread member 38. In addition, even when the female thread member 38 in a state of being engaged with the step section 36a of the storage hole 36 is pulled toward the installation plate 96 by the bolt 98 inserted in the installation plate 96, the female thread member 38 is unlikely to break because it has ductility. Consequently, it is possible to tighten the wafer placement table 10 including the brittle cooling substrate 30 to the installation plate 96 without a problem.

The storage hole 36 is provided in the refrigerant flow path 32. When the refrigerant flow path 32 is laid out avoiding the storage hole 36, the portion of the wafer W, immediately above the storage hole 36 is not sufficiently cooled, thus temperature singularity is likely to occur. However, since the storage hole 36 is provided in the refrigerant flow path 32, such temperature singularity can be prevented from occurring.

Because the cooling substrate 30 is composed of a brittle conductive material, application of the present invention has high significance.

Furthermore, the storage hole 36 includes the step section 36a as an engagement section, and the female thread member 38 includes the bottom surface as a to-be-engaged section. Thus, the engagement section and the to-be-engaged section can be produced relatively easily.

In addition, when the female thread member 38 is attempted to be axially rotated, it comes into contact with the side walls of the storage hole 36 to undergo restricted axial rotation. Thus, axial rotation of the female thread member 38 can be restricted by a relatively simple configuration.

In addition, the female thread member 38 is not connected to the cooling substrate 30 in the storage hole 36, and is stored in a free state. When the wafer placement table 10 is produced, the female thread member 38 only has to be inserted in the storage hole 36, which does not take much effort.

Note that the present invention is not limited to the above-described embodiment, and may be, of course, implemented in various modes within the technical scope of the present invention.

Figure 6:
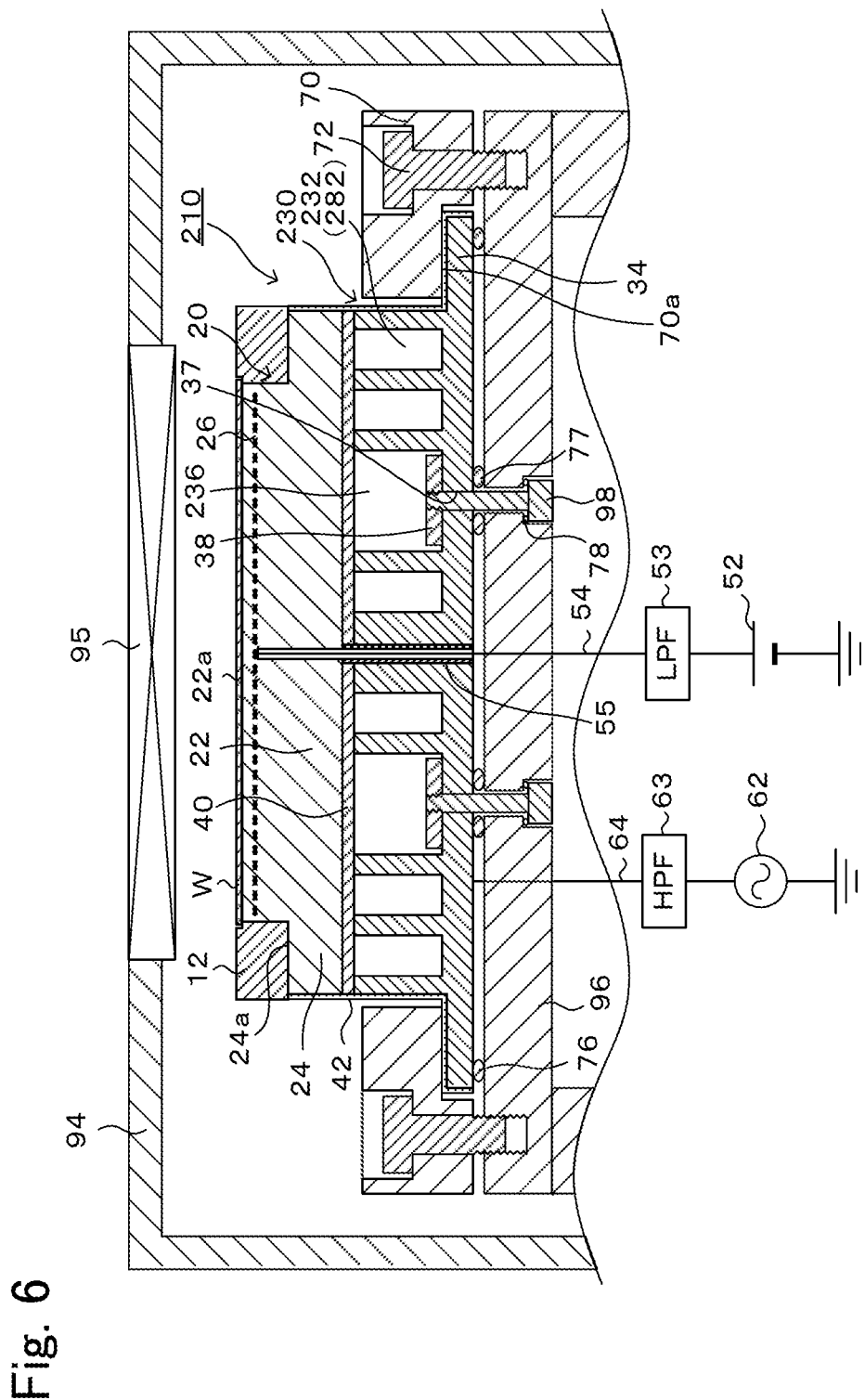
FIG. 6 is a vertical cross-sectional view of a wafer placement table 210.

In the embodiment described above, as illustrated in FIGS. 5A to 5G, the cooling substrate 30 has a layered structure in which two disk members 131, 133 are bonded. However, without being particularly limited to this, for example, as in a wafer placement table 210 illustrated in FIG. 6, a cooling substrate 230 with a single-layered structure may be used. In FIG. 6, the same components as in the above-described embodiment are labeled with the same symbol. The cooling substrate 230 has a refrigerant flow path groove 282 opened in the upper surface. A refrigerant flow path 232 is formed by covering the upper opening of the refrigerant flow path groove 282 with the metal bonding layer 40. A storage hole 236 is provided inside the refrigerant flow path 232 (the refrigerant flow path groove 282). The storage hole 236 is the same as the storage hole 36 except that the ceiling surface of the storage hole 236 is formed by the metal bonding layer 40. When the wafer placement table 210 is manufactured, the refrigerant flow path groove 282, the insertion path 37, and a hole for inserting the power supply terminal 54 are formed in one disk member, and subsequently, the alumina substrate 20 may be bonded to the disk member by TCB using a metal bonding material. Since the cooling substrate 230 has a single-layered structure, the manufacturing cost (material cost and manufacturing cost) of the cooling substrate 230 can be reduced as compared to a layered structure.

Figure 7:
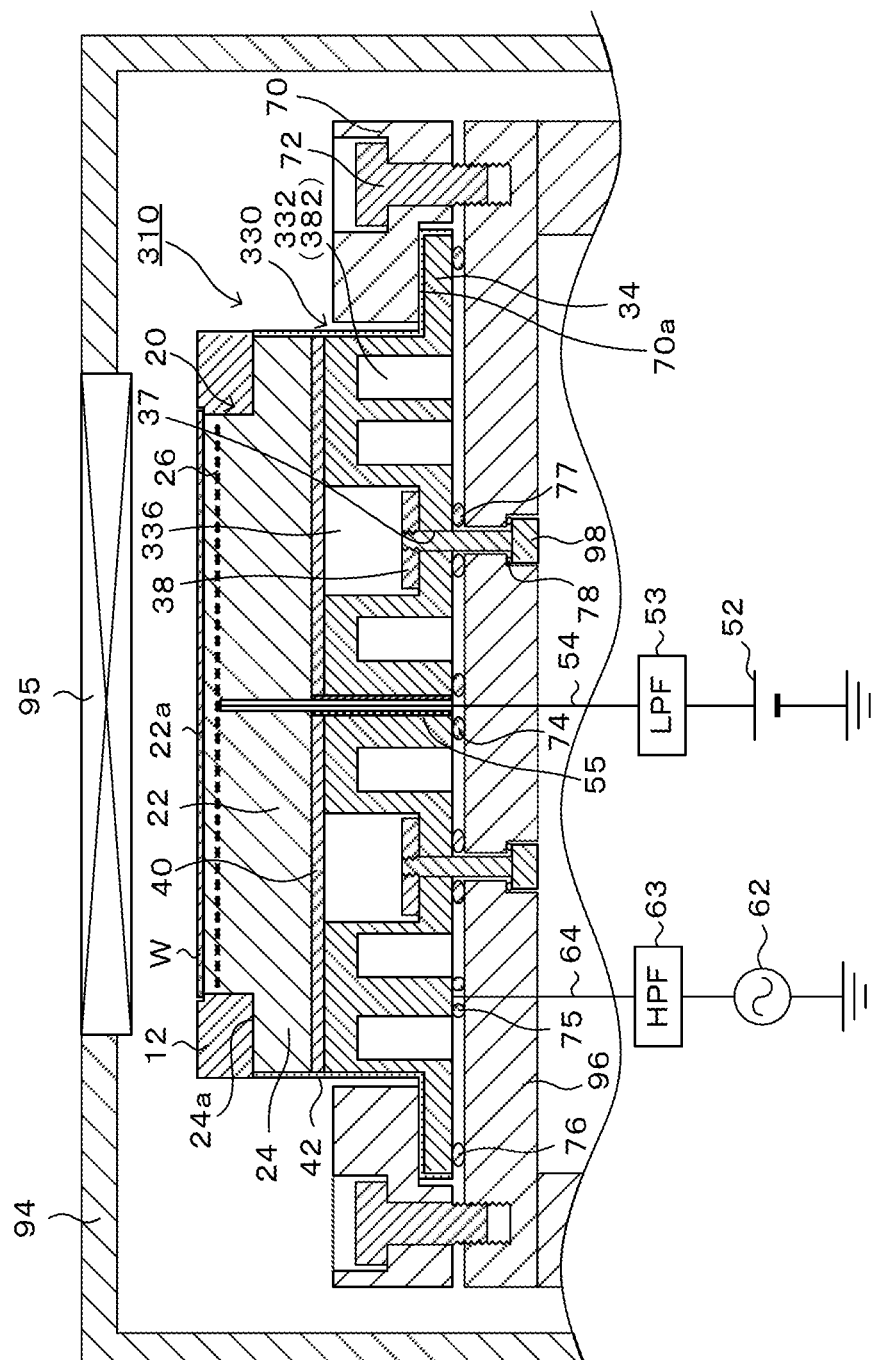
FIG. 7 is a vertical cross-sectional view of a wafer placement table 310.

Alternatively, as a wafer placement table 310 illustrated in FIG. 7, a cooling substrate 330 with a single-layered structure may be used. In FIG. 7, the same components as in the above-described embodiment are labeled with the same symbol. The cooling substrate 330 has a refrigerant flow path groove 382 opened in the lower surface. A refrigerant flow path 332 is formed by covering the lower opening of the refrigerant flow path groove 382 with the installation plate 96. Seal rings 74 to 77 are disposed between the cooling substrate 330 and the installation plate 96. The seal ring 74 is disposed to surround the periphery of the power supply terminal 54 to prevent the refrigerant from entering inside the seal ring 74. The seal ring 75 is disposed to surround the periphery of the power supply terminal 64 to prevent the refrigerant from entering inside the seal ring 75. The seal rings 76, 77 have been already described. The storage hole 336 is provided inside the refrigerant flow path 332 (refrigerant flow path groove 382). In the portion of the refrigerant flow path groove 382, where the storage hole 336 is provided, the lower section is closed, and the upper section is opened. The storage hole 336 is the same as the storage hole 36 except that the ceiling surface of the storage hole 336 is formed by the metal bonding layer 40. When the wafer placement table 310 is manufactured, the refrigerant flow path groove 382, the insertion path 37, and a hole for inserting the power supply terminal 54 are formed in one disk member, and subsequently, the alumina substrate 20 may be bonded to the disk member by TCB using a metal bonding material. Since the cooling substrate 330 has a single-layered structure, the manufacturing cost (material cost and manufacturing cost) of the cooling substrate 330 can be reduced as compared to a layered structure. Note that a sealing member to divide adjacent portions of the refrigerant flow path groove 382 may be disposed between the lower surface of the cooling substrate 330 and the upper surface of the installation plate 96.

Figure 8:
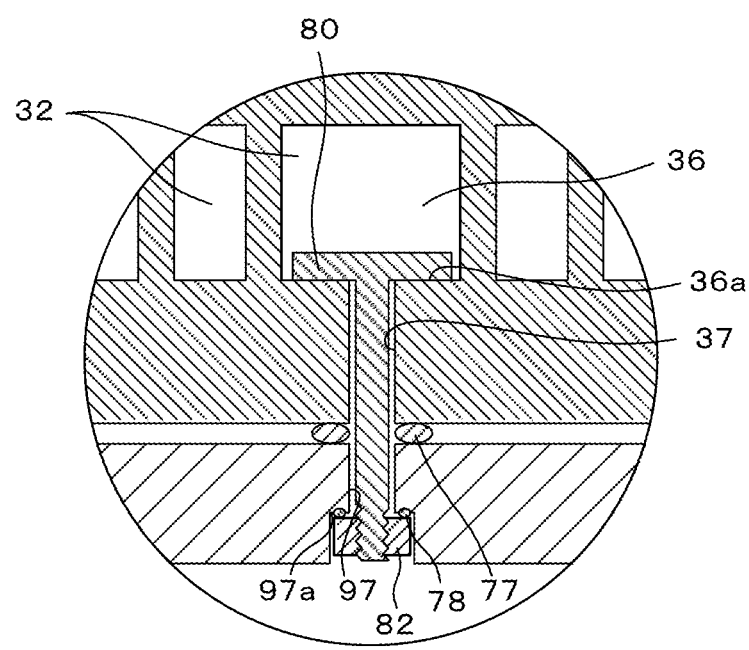
FIG. 8 is an enlarged cross-sectional view when a male thread member 80 is used as a connection member.

In the embodiment described above, the female thread member 38 is used as the connection member, and the bolt 98 is used as the to-be-connected member; however, as illustrated in FIG. 8, a male thread member 80 may be used as the connection member, and a nut 82 may be used as the to-be-connected member. In FIG. 8, the same components as in the above-described embodiment are labeled with the same symbol. The male thread member 80 is composed of a ductile material. The head of the male thread member 80 has the same shape as the female thread member 38. The foot of the male thread member 80 is inserted into the insertion path 37 and the through-hole 97, and a thread groove provided at the leading end of the foot of the male thread member 80 is screwed into the screw hole of the nut 82. The nut 82 is designed to hook to the step section 97a of the through-hole 97 with the seal ring 78 interposed therebetween. Since the lower surface of the male thread member 80 is engaged with the step section 36a of the storage hole 36, the male thread member 80 does not fall from the storage hole 36. When the male thread member 80 is attempted to be axially rotated, the head thereof comes into contact with the side walls of the storage hole 36 to undergo restricted axial rotation. Thus, the nut 82 can be screwed into the thread groove provided at the foot of the male thread member 80. When the nut 82 is screwed into the thread groove of the male thread member 80, the male thread member 80 is set in a state of being pulled toward the installation plate 96 with the head of the male thread member 80 engaged with the step section 36a of the storage hole 36. The same effects as in the above-described embodiment are also obtained when the configuration of FIG. 8 is used.

Figure 9:
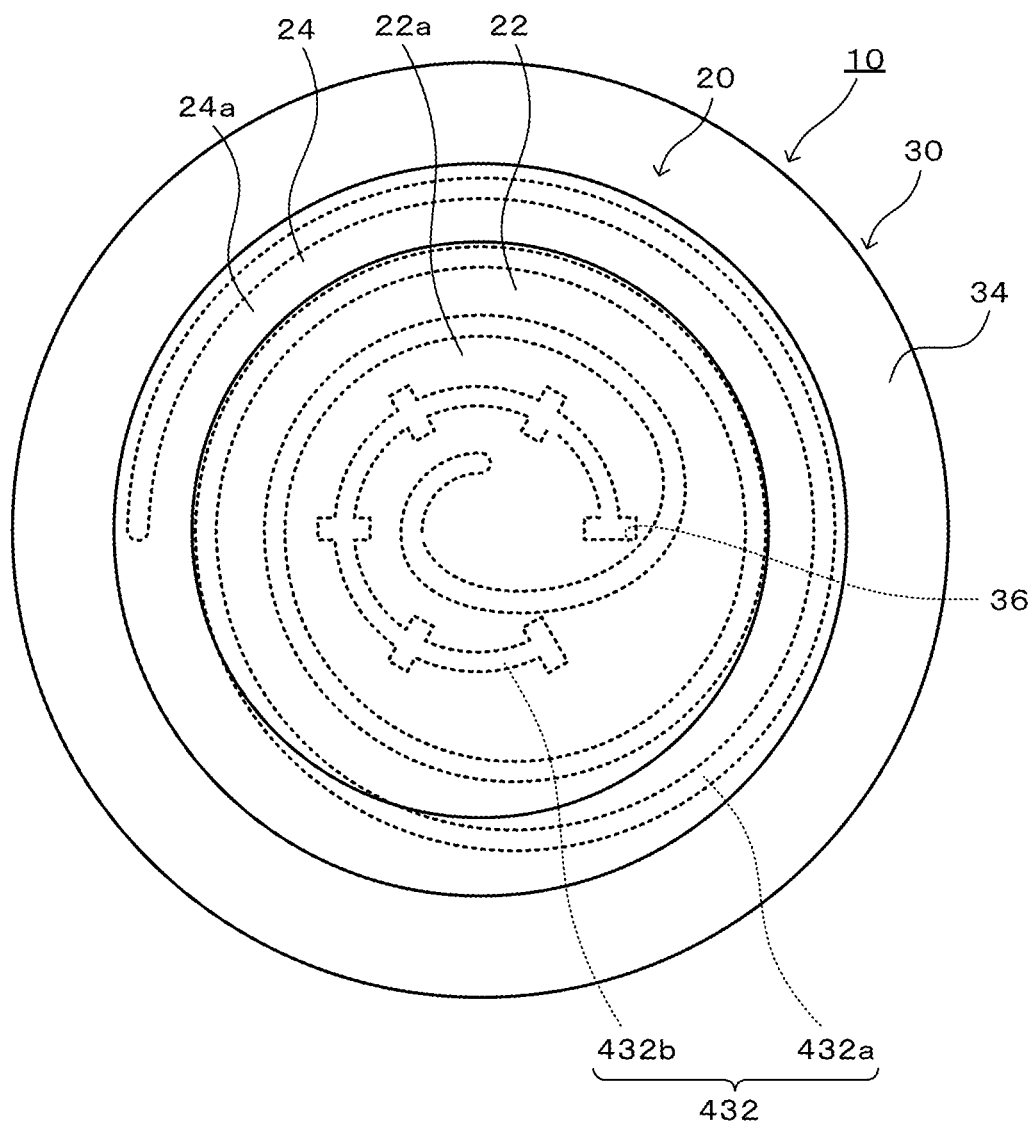
FIG. 9 is a plan view of another example of the wafer placement table 10.

In the embodiment described above, the refrigerant flow path 32 provided in the cooling substrate 30 has one line (one system). However, without being particularly limited to this, for example, the refrigerant flow path 32 may have two or more lines, the storage hole 36 may be provided inside one line, and other lines may not be provided with the storage hole 36. An example thereof is illustrated in FIG. 9. FIG. 9 is a plan view of another example of the wafer placement table 10, and the same components as in the above-described embodiment are labeled with the same symbol. The refrigerant flow path 432 has a first line 432a and a second line 432b. The first line 432a and the second line 432b do not intersect with each other, and are provided from one end (entry) to the other end (exit) in a one-stroke pattern in a plan view. Note that the one end (entry) and the other end (exit) are provided at different positions in a plan view. The refrigerant is individually supplied and discharged to and from the first line 432a and the second line 432b. Although the storage hole 36 is provided inside the second line 432b, the storage hole 36 is not provided inside the first line 432a. The same effects as in the above-described embodiment are also obtained when the configuration of FIG. 9 is used. Note that part of a plurality of storage holes 36 may be provided in the first line 432a, and the remaining part may be provided in the second line 432b. Alternatively, a line is provided for each storage hole 36, and a refrigerant may be individually supplied and discharged to and from each line.

In the embodiment described above, the female thread member 38 may be engaged with the step section 36a of the storage hole 36 with a stress buffering member interposed between the female thread member 38 and the step section 36a, the stress buffering member having a lower Young's modulus than the female thread member 38. For example, Ti alloy may serve as the female thread member 38, and pure Al may serve as the stress buffering member. In this way, even when the female thread member 38 is pulled toward the installation plate 96 by the bolts 98 provided in the installation plate 96, the stress tends to be dispersed because the stress buffering member is interposed between the female thread member 38 and the step section 36a. The stress buffering member may be, for example, a ring having at its center holes for inserting the feet of the bolts 98.

In the embodiment described above, the shape of the female thread member 38 is rectangular in a plan view. However, without being particularly limited to this, for example, the shape of the female thread member 38 may be a polygonal shape, such as a triangular shape and a pentagonal shape in a plan view, or may be a plus (+) shape or an elliptic shape. The shape of the storage hole 36 should be such that attempt to axially rotate the female thread member 38 causes itself to collide with the side walls.

In the embodiment described above, a hole may be provided which penetrates the wafer placement table 10 from the lower surface of the cooling substrate 30 to the wafer placement surface 22a. As such a hole, a gas supply hole for supplying a thermally conductive gas (for example, He gas) to the back surface of the wafer W, and a lift pin hole for inserting a lift pin to lift or lower the wafer W with respect to the wafer placement surface 22a may be mentioned. The thermally conductive gas is supplied to the space formed by the wafer W and a large number of small protrusions (to support the wafer W) which are provided on the wafer placement surface 22a and not illustrated. For example, when the wafer W is supported by three lift pins, lift pin holes are provided at three sites. Seal rings (for example, O-rings) made of resin or metal may be disposed at positions opposed to those holes, between the lower surface of the cooling substrate 30 and the upper surface of the installation plate 96. Since the central area of the wafer placement table 10 is fixed by the bolts 98, these seal rings are maintained in a firmly crushed state. Thus, these seal rings can secure the sealing property sufficiently.

In the embodiment described above, the cooling substrate 30 is produced with a brittle conductive material; however, the cooling substrate 30 may be produced with another brittle material (for example, an alumina material).

In the embodiment described above, the wafer adsorption electrode 26 is incorporated in the central section 22 of the alumina substrate 20; however, instead of or in addition to this, an RF electrode for plasma generation may be incorporated, or a heater electrode (resistance heating element) may be incorporated. In addition, a focus ring (FR) adsorption electrode may be incorporated, or an RF electrode or a heater electrode may be incorporated in the outer peripheral section 24 of the alumina substrate 20.

In the embodiment described above, the alumina sintered body 120 of FIG. 5A is produced by hot-press firing of a molded body of alumina powder, and the molded body may be produced by layering multiple tape molded bodies, or produced by a mold cast method, or produced by compacting alumina powder.

In the embodiment described above, the alumina substrate 20 and the cooling substrate 30 are bonded by the metal bonding layer 40; however, a resin bonding layer may be used instead of the metal bonding layer 40.

In the embodiment described above, the step section 36a (the horizontal bottom surface of the storage hole 36) of the storage hole 36 is used as an engagement section; however, instead of the step section 36a, an inclined section (a surface inclined down toward the insertion path 37) may be used as an engagement section. In that case, the bottom surface of the female thread member 38 may be an inclined surface conforming to the inclined section.

The present application claims priority from Japanese Patent Application No. 2022-072510 filed Apr. 26, 2022, the entire contents of which is incorporated herein by reference.

What is claimed is:

1. A wafer placement table comprising:
    an alumina substrate having a wafer placement surface at an upper surface, and incorporating an electrode;
    a brittle cooling substrate which is bonded to a lower surface of the alumina substrate, and in which a refrigerant flow path is formed; and
    a ductile connection member stored in a storage hole opened in a lower surface of the cooling substrate in a state of restricted axial rotation and in a state of being engaged with an engagement section of the storage hole, the ductile connection member having a male thread section or a female thread section,
    wherein the storage hole is provided in the refrigerant flow path.

2. The wafer placement table according to claim 1,
    wherein the connection member is a member having the female thread section, and being screwable to a male thread of a bolt inserted from a lower surface side of the cooling substrate.

3. The wafer placement table according to claim 2, wherein the connection member having the female thread section is of a shape selected from the group consisting of rectangular, triangular, pentagonal, plus (+) and elliptic.

4. The wafer placement table according to claim 1, wherein the cooling substrate is composed of a metal matrix composite or an alumina material.

5. The wafer placement table according to claim 1, wherein the engagement section is a step section or an inclined section provided in an inner peripheral surface of the storage hole, and the connection member has a to-be-engaged section which is to be engaged with the engagement section to prevent the connection member from falling from the storage hole.

6. The wafer placement table according to claim 5, further including a stress buffering member interposed between the step section of the engagement section and the connection member.

7. The wafer placement table according to claim 1, wherein when being attempted to be axially rotated, the connection member comes into contact with a wall of the storage hole to undergo restricted axial rotation.

8. The wafer placement table according to claim 1, wherein the cooling substrate has a single-layered structure.

9. The wafer placement table according to claim 8, wherein the refrigerant flow path has a refrigerant flow path groove provided in an upper surface or a lower surface of the cooling substrate.

10. The wafer placement table according to claim 1, wherein the refrigerant flow path includes a plurality of lines each provided from one end to the other end in a one-stroke pattern in a plan view, and the storage hole is provided in one or more of the plurality of lines.

11. The wafer placement table according to claim 1, wherein the storage hole provided in the refrigerant flow path is a cuboid-shaped space.

12. The wafer placement table according to claim 1, further including a plurality of storage holes provided at about regular intervals along a concentric circle of the cooling substrate.

* * * * *